(12) United States Patent
Taniguchi

(10) Patent No.: US 6,559,494 B1
(45) Date of Patent: *May 6, 2003

(54) SEMICONDUCTOR DEVICE AND A METHOD FOR FABRICATING THE SAME

(75) Inventor: Koji Taniguchi, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 11 days.

(21) Appl. No.: 08/909,309

(22) Filed: Aug. 11, 1997

(30) Foreign Application Priority Data

Feb. 27, 1997 (JP) .............................. 9-044094

(51) Int. Cl.[7] ...................... H01L 27/108; H01L 29/76; H01L 29/94; H01L 31/119
(52) U.S. Cl. ..................................... 257/306
(58) Field of Search ............... 257/300–310; 438/240–258, 396–399

(56) References Cited

U.S. PATENT DOCUMENTS

| | | | | | |
|---|---|---|---|---|---|
| 4,818,714 A | * | 4/1989 | Haskell | ...................... | 438/305 |
| 5,331,191 A | * | 7/1994 | Sugiura et al. | .............. | 257/336 |
| 5,441,906 A | * | 8/1995 | Burger | ....................... | 438/305 |
| 5,480,826 A | * | 1/1996 | Sugahara et al. | ........... | 438/398 |
| 5,528,542 A | * | 6/1996 | Okamura | .................... | 257/368 |
| 5,554,557 A | | 9/1996 | Koh | | |
| 5,567,640 A | * | 10/1996 | Tseng | ......................... | 438/396 |
| 5,668,036 A | * | 9/1997 | Sune | ........................... | 438/253 |
| 5,693,970 A | * | 12/1997 | Ikemasu | ..................... | 257/309 |
| 5,700,731 A | * | 12/1997 | Lin et al. | ..................... | 438/397 |
| 5,721,154 A | * | 2/1998 | Jeng | ............................ | 438/396 |
| 5,726,083 A | * | 3/1998 | Takaishi | ..................... | 438/253 |
| 5,733,808 A | * | 3/1998 | Tseng | ......................... | 438/253 |
| 5,759,889 A | * | 6/1998 | Sakao | ......................... | 438/241 |
| 5,763,311 A | * | 6/1998 | Gardner et al. | ............. | 438/305 |
| 5,792,681 A | * | 8/1998 | Chang et al. | ............... | 438/253 |
| 5,792,687 A | * | 8/1998 | Jeng et al. | .................. | 438/253 |
| 5,804,479 A | * | 9/1998 | Aoki et al. | .................. | 438/253 |

FOREIGN PATENT DOCUMENTS

| | | |
|---|---|---|
| DE | 42 03 400 A1 | 8/1992 |
| DE | 43 23 961 A1 | 1/1994 |
| JP | 4-215471 | 6/1992 |
| JP | 6-163535 | 6/1994 |
| JP | 6-177147 | 6/1994 |
| JP | 7-263554 | 10/1995 |
| JP | 8-37145 | 2/1996 |

* cited by examiner

Primary Examiner—Cuong Quang Nguyen
(74) Attorney, Agent, or Firm—McDermott, Will & Emery

(57) ABSTRACT

In the fabrication of semiconductor devices, and particularly, semiconductor memories, a gate oxide film and a gate electrode are formed on a semiconductor substrate, and a silicon oxide film is formed on the gate electrode. Thereafter, the entire surface is covered with a silicon nitride film and then with an interlayer oxide film. Bit line contacts are formed in source/drain regions each provided between adjacent gate electrodes according to a SAC technique utilizing the silicon nitride film. In the other source/drain region, a hole is made in the silicon nitride film to form a storage node contact.

13 Claims, 16 Drawing Sheets

US 6,559,494 B1

SEMICONDUCTOR DEVICE AND A METHOD FOR FABRICATING THE SAME

TECHNICAL FIELD

This invention relates to a semiconductor device and a method for fabricating the semiconductor device, which is particularly suitable for fabricating a semiconductor memory device.

More particularly, this invention relates to a structure of a semiconductor device and a method for fabricating such a semiconductor device, which is obtained by utilizing a self aligned contact (SAC) technique for forming a contact hole above each active region of the semiconductor device. A DRAM device or the like obtained by this invention shows little or no degradation of data retention characteristics.

BACKGROUND ART

A method of fabricating a DRAM according to a design rule of approximately 3 μm is described as an example in order to illustrate a conventional method of fabricating a semiconductor device using the SAC technique. FIGS. 21 to 40 are, respectively, sectional views for illustrating a conventional method of fabricating a DRAM.

Reference is now made to FIG. 21. Initially, a silicon semiconductor substrate 1 is entirely formed with an approximately 100 angstroms thick silicon thermal oxidation film 2 thereon by thermal oxidation, which is followed by further deposition of an approximately 500 angstroms thick silicon nitride film 3 by CVD. Subsequently, using photomechanical and etching techniques, the silicon nitride film 3 is selectively left only in regions wherein an element is to be formed.

Referring to FIG. 22, a thermal oxidation film 4 is selectively formed between the nitride films 3 with a thickness of approximately 3000 angstroms by thermal oxidation to provide an element separation oxide film, which is followed by removal of the nitride films 3 to form an element-forming region. In the figure, the left-side half indicates a memory cell portion A and the right-side half indicates a peripheral circuit portion B.

Next, a thermal oxidation film 5 which serves as a gate oxide film of a transistor is formed with a thickness of approximately 90 angstroms by thermal oxidation. Thereafter, phosphorus-doped polysilicon film 6 wherein phosphorus (P) is doped at a concentration of approximately $5 \times 10^{20}$ atoms/cm$^3$, and tungsten silicide film (WSi$_2$) 7 are, respectively, deposited with a thickness of approximately 500 angstroms by CVD to form a double-layered film 8 (which may be hereinafter referred to simply as a polyside).

Further, a silicon nitride film 27 is formed with a thickness of approximately 1000 angstroms by CVD. The silicon nitride film 27 serves as an etching mask at the time of the formation of a polyside gate and also as a stopper at the time of making holes for SAC. It will be noted that in FIGS. 22 to 40, the reference numeral 1 indicating the semiconductor substrate is, for convenience, not shown.

In FIG. 23, the nitride film 27 is subjected to photomechanical and anisotropic etching to leave desired portions of the nitride film 27 in a pattern. The polyside film 8 is anisotropically etched through the pattern of the nitride film 27 to form gate electrodes 8 with a gate length of approximately 0.3 μm. The polyside film 8 is etched to extend just above the gate oxide film 5 as shown.

Subsequently, phosphorus ions are self-alignedly implanted into the respective gate electrodes 8 and the element separation oxide films 4 at a concentration of approximately $1 \times 10^{13}$ atoms/cm2 by an ion implantation, thereby forming lightly doped source/drain regions of a MOS transistor, i.e. so-called n-source/drain regions 10a, 10b, 10c and 10d. In the figure, the source/drain region 10a is connected with a bit line through a contact hole in a subsequent step, and the source/drain region 10b is connected with a lower electrode of a capacitor through another contact hole in a subsequent step.

Referring to FIG. 24, a silicon nitride film 11 is deposited with a thickness of approximately 800 angstroms by CVD. The nitride film 11 serves as side walls of a transistor having an LDD structure.

In FIG. 25, the silicon nitride film 11 is anisotropically etched to leave side walls 11a of the nitride film at the side walls of each gate electrode 8. The width, W1, of the side wall 11a is approximately 800 angstroms. It should be noted that the thin gate oxide film 5 does not act as a stopper for the anisotropic etching of the nitride film, but is readily removed by over-etching, thereby causing the source/drain regions 10a, 10b to be exposed.

In FIG. 26, the memory cell portion A is covered with a resist 12 according to a photomechanical technique. Using ion implantation, the gate electrode 8, the element separation oxide film 4 and the side walls 11a of the nitride film are self-alignedly implanted with arsenic at a concentration of approximately $5 \times 10^{15}$ atoms/cm2, respectively, thereby forming a heavily doped source/drain region, i.e. a so-called n+ source/drain region 13, of the MOS transistor.

At that time, the memory cell portion A has been covered with the resist 12, so that such an n+ source/drain region as mentioned above is prevented from being formed in the memory cell portion A. In the event that the n+ source/drain region is formed in the memory cell portion A, junction leakage current increases to degrade data retention characteristics. Accordingly, only the lightly doped n– source/drain regions are formed in the memory cell portion A.

In FIG. 27, the resist 12 is removed from the memory cell portion A, and an oxide film containing boron and phosphorus (hereinafter referred to simply as BPSG) is deposited with a thickness of approximately 4000 angstroms by CVD, thereby forming an interlayer insulating film 14.

It should be noted here that in the above case, it is not appropriate to use an oxide film which is free of any boron or phosphorus, e.g. an TEOS oxide film. This is because an oxide film free of boron or phosphorus exhibits only a small selection ratio relative to the nitride film used as an etching stopper at the time of making a hole for SAC.

Referring to FIG. 28, the thermal treatment is carried out in an atmosphere of nitrogen at approximately 850° C. for 20 minutes, by which the BPSG is thermally sagged to make the layer insulating film 14 flat on the surface thereof. At that time, the oxide film 14 at a portion where SAC is to be formed between the gate electrodes 8 has a thickness, t1, of approximately 6000 angstroms.

In FIG. 29, bit line contact holes 15 each having a diameter of approximately 0.3 μm are, respectively, formed above the source/drain 10a of the memory cell portion A and the source/drain region 10c of the peripheral circuit portion B according to photomechanical and anisotropic oxide film-dry etching techniques. Each hole 15 is formed to connect a bit line and an active region therewith. At the time of the formation of the contact holes 15, the BPSG is over-etched by 30% which corresponds to a thickness of 9000 angstroms of the BPSG. Because the etching rate of the nitride film is about 1/20 of that of BPSG, the nitride film 27 located above the source/drain region 10a of the memory cell portion is etched by a thickness, t2, of approximately 250 angstroms.

In FIG. 30, as in the case of the gate electrodes 8, a polyside layer 18 composed of a phosphorus-doped polysilicon film 16 and a tungsten silicide (WSi$_2$) film 17 is deposited by CVD to fill the bit line contact hole therewith, followed by formation of a desired pattern by photomechanical and anisotropic dry etching techniques to form polyside interconnections 18. The line width, W2, of the polyside interconnection 18 is in the range of approximately 0.3 to 0.5 μm, and the interconnections serve as a bit line of a DRAM and are, respectively, connected via the bit line contact holes 15 to the source/drain regions 10a, 10c.

In FIG. 31, an approximately 3000 angstroms thick silicon oxide film is deposited over the substrate by CVD to form an interlayer insulating film 19.

In FIG. 32, a storage node contact hole 20 having a diameter of approximately 0.3 μm is formed above the source/drain region 10b of the memory cell portion according to photomechanical and anisotropic oxide film dry etching techniques. This hole 20 is a contact hole for connection between a lower electrode of a capacitor (hereinafter referred to as a storage node) and the active region 10b.

Referring to FIG. 33, after deposition of an approximately 7000 angstroms thick phosphorus-doped polysilicon film wherein phosphorous is doped at a concentration of approximately 5×10$^{20}$ atoms/cm3, the phosphorus-doped polysilicon film is subjected to photomechanical and anisotropic dry etching techniques in a desired pattern to form storage nodes 21. The space, W3, between the storage nodes 21 should be as small as possible in order to make a large surface area of the storage nodes 21, and is usually approximately 0.25 μm. These respective storage nodes 21 are connected via the storage node contact holes 20 to the n– source/drain regions 10b of the memory cell portion A.

In FIG. 34, a nitride film 22 serving as a capacitor dielectric film is deposited with a thickness of 60 angstroms, and then a phosphorus-doped polysilicon film 23 doped at a concentration of approximately 5×10$^{20}$ atoms/cm$^3$ is deposited with a thickness of 1000 angstroms, and is used as an upper electrode 23 of a capacitor (hereinafter referred to as cell plate). The phosphorus-doped polysilicon film 23 formed in portions other than the memory cell portion A is removed by photomechanical and anisotropic dry etching techniques to form a cell plate 23, thereby completing a capacitor.

In FIG. 35, BPSG is deposited with a thickness of approximately 5000 angstroms by CVD to form an interlayer insulating film 24.

In FIG. 36, as in the case of the interlayer insulating film 14, thermal treatment is carried out in an atmosphere of nitrogen at about 850° C. for about 30 minutes to make a smooth surface profile of the interlayer insulating film 24.

In FIG. 37, contact holes 25a each having a diameter of 0.3 to 0.4 μm are, respectively, formed above and to the depth of the source/drain 10d of the peripheral circuit portion B and also above and to the depth of the bit line 18 formed in the peripheral circuit portion B by photomechanical and anisotropic oxide film dry etching techniques. The contact to the gate electrode 8 of the peripheral circuit portion B cannot be simultaneously formed, since the nitride film 27 is formed on the gate electrode 8, so that the etching of the oxide film is stopped at the nitride film 27.

In FIG. 38, a gate contact hole 25b is formed above the gate electrode 8 of the peripheral circuit portion B. In the figure, a hole has been made to the nitride film 27 by anisotropic dry etching.

Thereafter, as shown in FIG. 39, the nitride film is further etched from the gate contact hole 25b to make a hole in the nitride film 27 so that the upper surface of the gate electrode 8 is exposed.

In FIG. 40, aluminum film 26 is deposited with a thickness of approximately 5000 angstroms by sputtering to fill the contact holes 25a, 25b therewith, followed by patterning by photomechanical and anisotropic dry etching techniques to leave desired portions of the aluminum film, thereby forming aluminum interconnections 26 each having a width of approximately 0.4 μm.

The conventional fabrication method of DRAM by use of the SAC technique has been described above. According to this method, the source/drain regions 10b are contacted with the storage nodes 21 after the formation of the storage node contact holes 20 in the memory cell portion A. During the course of the step of anisotropically etching the nitride film to form the side walls 11a made of the nitride film as shown in FIG. 25, the source/drain regions 10b are damaged by the etching, thus leading to considerable degradation of data retention characteristics.

In the peripheral circuit portion B, the silicon nitride film 27 is formed on the gate electrode 8, so that the formation of the contact holes undesirably requires two steps including the step of forming the contact hole 25a above the source/drain region 10d and the bit line 18, and the step of forming the contact hole 25b above the gate electrode 8.

DISCLOSURE OF THE INVENTION

Accordingly, an object of the present invention is to provide a semiconductor device and a method for fabricating the same using the SAC technique, which overcome the drawbacks of the conventional art and which involve little or no degradation of data retention characteristics, and which further reduces the fabrication steps.

According to one aspect of the present invention, in a method for fabricating a semiconductor device, a first insulating film is formed on a main surface of a silicon semiconductor substrate including a memory cell-forming portion and a peripheral circuit-forming portion. A first conductive layer is formed on said first insulating film. A silicon oxide film is formed on said first conductive layer. Said silicon oxide film and said first conductive layer are subjected to patterning to form a plurality of gate electrodes each having the silicon oxide film thereon. An impurity is introduced into the main surface of said semiconductor substrate at portions between any adjacent gate electrodes to form a plurality of active regions. A silicon nitride film is formed over the entire surface of said semiconductor substrate including said first insulating film and the plurality of gate electrodes. Said silicon nitride film in a peripheral circuit-forming portion of said semiconductor substrate is anisotropically etched to form side walls of said silicon nitride film on the side surfaces of each gate electrode. Simultaneously, a second insulating film is formed on the entire surface of said semiconductor substrate including said silicon nitride film of said memory cell-forming portion, and said silicon oxide film on each gate electrode, and the side walls of said silicon nitride film in the peripheral circuit-forming portion. Holes are made in said second insulating film, each between a pair of gate electrodes selected among the plurality of gate electrodes in said memory cell-forming portion. Further, the holes are extended from the first-mentioned holes to said silicon nitride film which is formed on said first insulating film and also to said first insulating film between the silicon nitride films which are formed on the side surfaces of the adjacent gate electrodes. Thereby, contacts arriving at the selected active regions are formed respectively. A hole is made in said second insulating film and said silicon oxide film on the gate electrode to form a contact extending to the gate electrode in the peripheral circuit-forming portion. Simultaneously, holes are made in said second insulating film on the active regions of said semiconductor substrate to form contacts extending to said active regions respectively.

In the above description, a method for fabricating a memory cell-forming portion of the semiconductor device is summarized as follows. First, a first insulating film is formed on a main surface of a silicon semiconductor substrate. A first conductive layer is formed on said first insulating film. A silicon oxide film is formed on said first conductive layer. Said silicon oxide film and said first conductive layer is subjected to patterning to form a plurality of gate electrodes each having said oxide film on the upper surface. An impurity is introduced into the main surface of said semiconductor substrate at portions between adjacent gate electrodes to form a plurality of active regions. A silicon nitride film is formed over the entire surface of said semiconductor substrate including said first insulating film and said plurality of gate electrodes. A second insulating film is formed on said silicon nitride film. Holes are made in said second insulating film, each between the adjacent gate electrodes selected among the plurality of gate electrodes. Further the holes are extended from the first-mentioned holes to said silicon nitride film which are formed on said first insulating film and also to said first insulating film between the silicon nitride films which are formed on the side surfaces of the adjacent gate electrodes. Thereby, contacts arriving at the selected active regions are formed.

In the above description, a method for fabricating a peripheral circuit-forming portion of the semiconductor device is summarized as follows. First, a first insulating film is formed on a main surface of a silicon semiconductor substrate. A first conductive layer is formed on said first insulating film. A first silicon oxide film is formed on said first conductive layer. Said silicon oxide film and said first conductive layer are subjected to patterning to form a plurality of gate electrodes each having said silicon oxide film on the upper surface. An impurity is introduced into the main surface of said semiconductor substrate at portions between any adjacent gate electrodes to form a plurality of active regions. A silicon nitride film is formed over the entire surface of said semiconductor substrate including said first insulating film and said plurality of gate electrodes. Said silicon nitride film is anisotropically etched to form side walls of the silicon nitride film on the side surfaces of each gate electrode. A second insulating film is formed over the entire surface of said semiconductor substrate including said silicon oxide film of the plural gate electrodes and the side walls of said silicon nitride film. A hole is made in said second insulating film and said silicon oxide film which is formed on each gate electrode to form a contact extending to said gate electrode. At the same time, another hole is formed in said second insulating film on each active region of said semiconductor substrate to form a contact extending to said each active region.

In another aspect of the present invention, in the method for fabricating a semiconductor device, said second insulating film is formed of silicon oxide.

In another aspect of the present invention, in the method for fabricating a semiconductor device, said first insulating film is formed of silicon oxide.

According to another aspect of the present invention, a semiconductor device comprises a plurality of active regions formed on a main surface of a semiconductor substrate having a memory cell portion and a peripheral circuit portion. A first insulating film is formed between individual pairs of active regions. A first conductive layer is formed on said first insulating film. A silicon oxide film is formed on said first conductive layer. A plurality of gate electrodes are then formed by pattering of said silicon oxide film and said first conductive layer.

Said memory cell portion comprises a silicon nitride film formed on the entire surface of said semiconductor substrate to cover said silicon oxide film and said first conductive film. A second insulating film is formed on said silicon nitride film. A contact is formed between any adjacent gate electrodes and between the silicon nitride films formed on the side surfaces of the adjacent gate electrodes, and extends to the active region via said second insulating film, said silicon nitride film formed on said fist insulating film, and said first insulating film.

The peripheral circuit portion comprises a silicon nitride film formed on side surfaces of said conductive film, a second insulating film formed on an entire surface of said semiconductor substrate to cover said silicon oxide film and said silicon nitride film. A contact is formed above each gate electrode, and extends via said second insulating film and said silicon oxide film to the gate electrode. Another contact is formed above the active region, and extends via said insulating film and said first insulating film to said active region.

In another aspect of the present invention, in the semiconductor device, said active region is constituted as source/drain of a MOS transistor.

In another aspect of the present invention, in the semiconductor device, said contact of said memory cell portion is formed as a contact with a bit line of said memory cell or as a contact with a storage node.

Additional advantages, advantages and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements.

BEST MODE FOR CARRYING OUT THE INVENTION

A method for fabricating a semiconductor device according to an embodiment of the present invention is described below particularly with regard to a method for fabricating a DRAM whose design rule is at a level of approximately 0.3 $\mu$m. Also a semiconductor device according to the present invention is illustrated with regard to DRAM fabricated by the above fabrication method.

Reference is now made to FIGS. 1 to 20 which are, respectively, sectional views illustrating a method for fabricating a DRAM and the structure of the DRAM according to the present invention.

Initially, the fabrication method is described. As is particularly shown in FIG. 1, a silicon semiconductor substrate 1 is subjected to thermal oxidation on the entire surface thereof to form an approximately 100 angstroms thick silicon thermal oxidation film 2. Next, a silicon nitride film 3 having a thickness of approximately 500 angstroms is deposited over the substrate by CVD.

Figure 1:
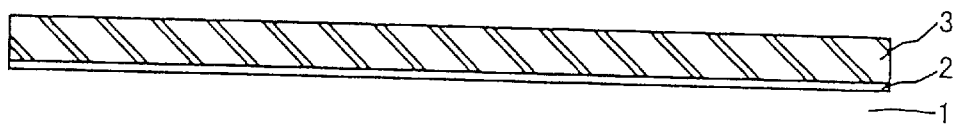
FIGS. 1 to 20 are sectional views illustrating a method for fabricating a DRAM and illustrating the structure of the DRAM according to the present invention.
Figure 2:
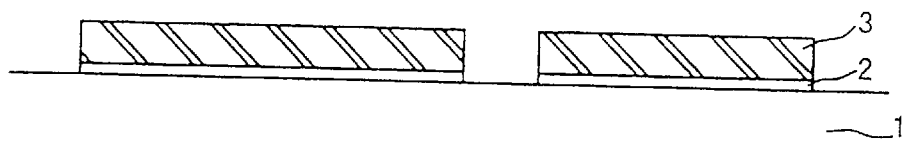

Referring to FIG. 2, the nitride film 3 is subjected to patterning by photomechanical and etching techniques to leave the nitride film 3 only in regions where elements are to be made, for example, as a memory cell portion or a peripheral circuit portion.

Figure 3:
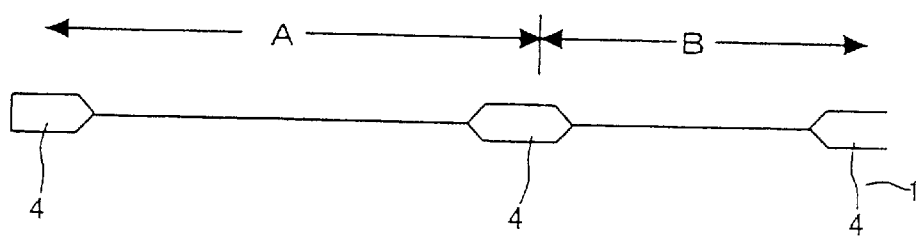

In FIG. 3, a silicon thermal oxidation film having a thickness of approximately 3000 angstroms is selectively formed by thermal oxidation to form element separation oxide films 4 as shown. Thereafter, the portions of the nitride film 3 are removed to form element-forming regions serving as a memory cell portion and a peripheral circuit portion. In the figure, the memory cell portion is indicated as A, and the peripheral portion is indicated as B.

Figure 4:
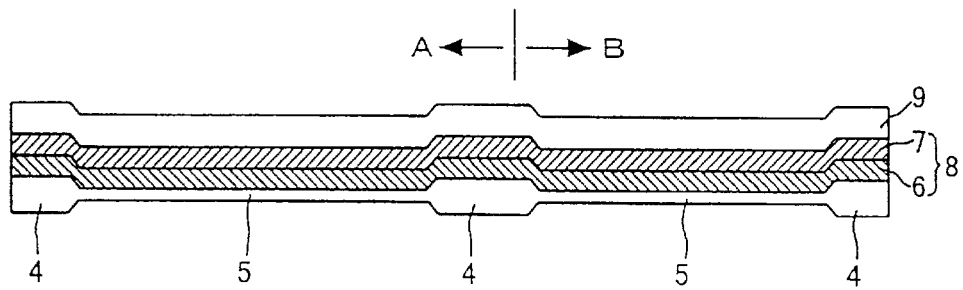

In FIG. 4, a silicon thermal oxidation film 5 (i.e. first insulating film) which will constitute a gate oxide film of a transistor is formed with a thickness of approximately 90 angstroms by thermal oxidation. Thereafter, phosphorus-doped polysilicon film 6, wherein phosphorus is doped at a concentration of approximately $5 \times 10^{20}$ atoms/cm$^3$ and tungsten silicide film (WSi$_2$) 7 are, respectively, deposited with a thickness of approximately 500 angstroms by CVD, thereby forming a so-called polyside double-layered film 8 (first conductive film) (which may be sometimes hereinafter referred to simply as a polyside). Further, an approximately 1000 angstroms thick silicon oxide film 9 is deposited by CVD as shown. It will be noted that in FIGS. 4 to 19, reference numeral 1 indicating the semiconductor substrate is not shown only for simplicity.

Figure 5:
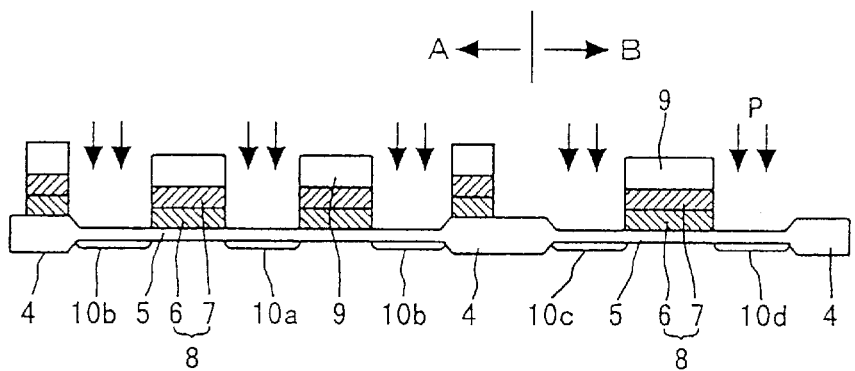

In FIG. 5, the silicon oxide film 9 is subjected to patterning according to photomechanical and anisotropic etching techniques to leave desired portions of the silicon oxide film 9 as a mask. Subsequently, the polyside 8 is anisotropically etched through the mask of the patterned oxide film 9 to form gate electrodes having a gate length of approximately 0.3 μm. The etching of the polyside should be stopped just above the gate oxide film 5.

Next, using an ion implantation technique, phosphorus ions are self-alignedly implanted into the gate electrodes 8 and the element separation oxide films 4 at a concentration of approximately $1 \times 10^{13}$ atoms/cm$^2$, thereby forming active regions, or lightly doped source/drain regions of a MOS transistor. More particularly, there are formed so-called n– source/drain regions 10a, 10b, 10c and 10d. In the figure, the source/drain region 10a of the memory cell portion A is connected with a bit line via a contact hole in a subsequent step. Likewise, the source/drain region 10b is connected with a lower electrode of a capacitor via another contact hole in a subsequent step.

Figure 6:
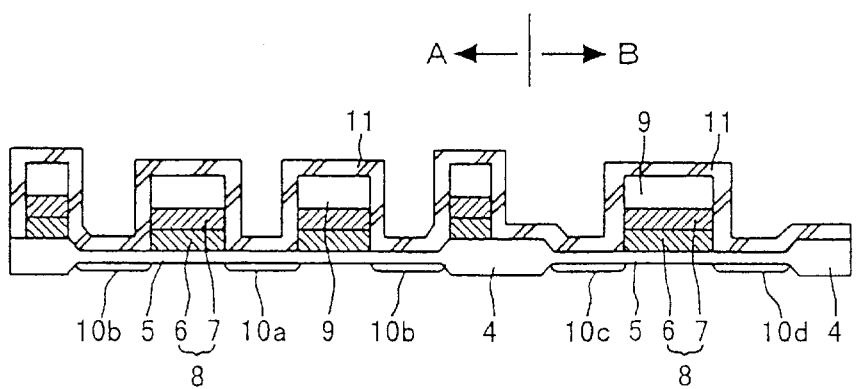

In FIG. 6, a silicon nitride film 11 is deposited with a thickness of approximately 800 angstroms by CVD. The silicon nitride film 11 serves as side walls of the MOS transistor having an LDD structure.

Figure 7:
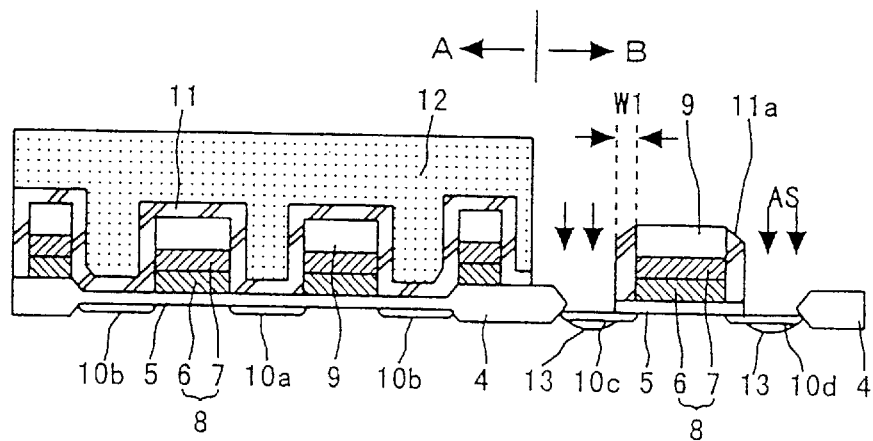

In FIG. 7, the memory cell portion A is entirely covered with a resist 12 by a photomechanical technique. In this condition, the gate electrode 8 of the peripheral circuit portion B is etched by an anisotropic nitride film etching so that side walls 11a of the nitride film each having a thickness, W1, of approximately 800 angstroms are formed on the side walls of the gate electrode 8 of the transistor.

Subsequently, arsenic ions are implanted into the element separation oxide film 4 and the side walls 11a of the nitride film of the peripheral circuit portion B at a concentration of approximately $5 \times 10^{15}$ atoms/cm$^2$ by ion implantation. As a result, there is self-alignedly formed, as an active region, a heavily doped source/drain region of the MOS transistor, or a so-called n+ source/drain region 13.

It should be noted that if an n+ source/drain region is formed in the memory cell portion, junction leakage current increases to degrade data retention characteristics, so that any heavily doped source/drain region is not formed in the memory cell portion A, but lightly doped n– source/drain regions alone are formed.

Figure 8:
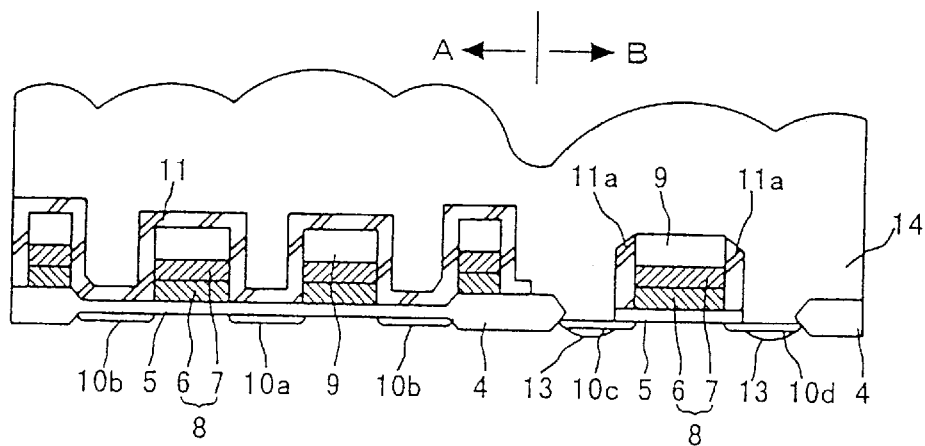

As shown in FIG. 8, the resist 12 is removed from the memory cell portion A, after which an oxide film containing boron and phosphorus (which may be sometimes referred to simply as BPSG) is entirely formed over the substrate in a thickness of approximately 4000 angstroms to provide an interlayer insulating film 14 (second insulating film).

For the formation of the insulating film 14, any oxide which is free of boron or phosphorus, e.g. a TEOS oxide film, should not be used. This is because an oxide film which does not contain boron or phosphorus has only a small etching selection ratio to the nitride film serving as an etching stopper, and is thus undesirable when a hole for SAC is made.

Figure 9:
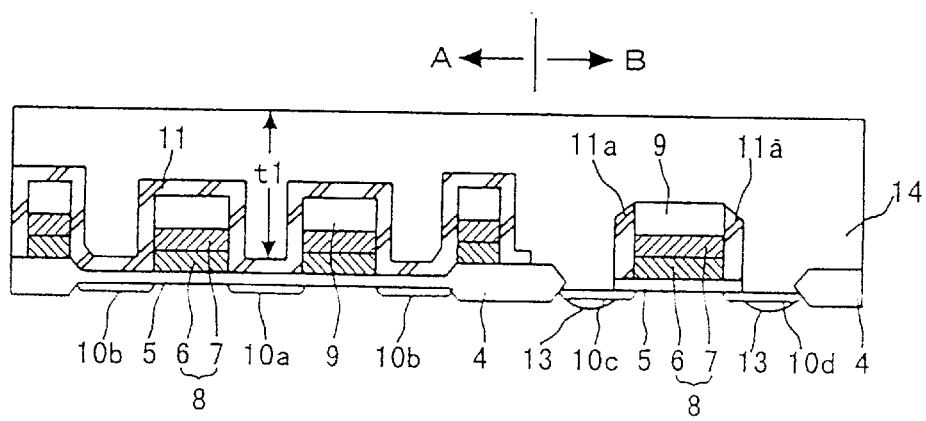

In FIG. 9, the thermal treatment in an atmosphere of nitrogen at about 850° C. is carried out for about 20 minutes to cause the BPSG to be thermally sagged to make the interlayer insulating film 14 flat on the surface thereof. At that time, the thickness, t1, of the oxide film in which SAC is formed between the gate electrodes 8 is approximately 6000 angstroms.

Figure 10:
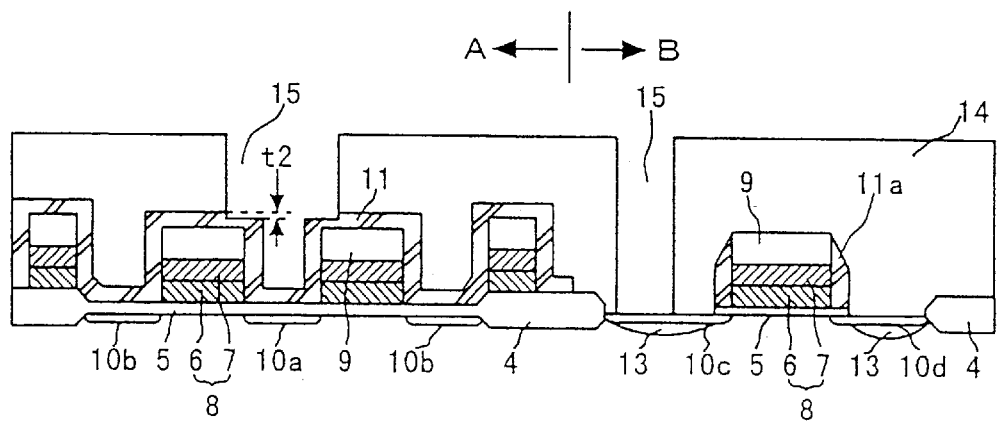

In FIG. 10, a hole is made in the oxide film 14 at a portion provided above the source/drain region 10a and between the adjacent gate electrodes 8 of the memory cell portion A, and also at a portion of the oxide film 14 above the source/drain region 10c of the peripheral circuit portion B. Eventually, there are formed bit line contact holes 15 each having a diameter of approximately 0.3 μm. The etching above the source/drain region 10a of the memory cell portion A is stopped at a level just above the silicon nitride film 11. When the quantity of over-etching of the oxide film 14 is taken as 30% and BSPG is etched to a level corresponding to 9000 angstroms, the silicon nitride film 11 is etched by approximately 250 angstroms since the etching rate of the silicon nitride film is about 1/20 of BSPG.

Figure 11:
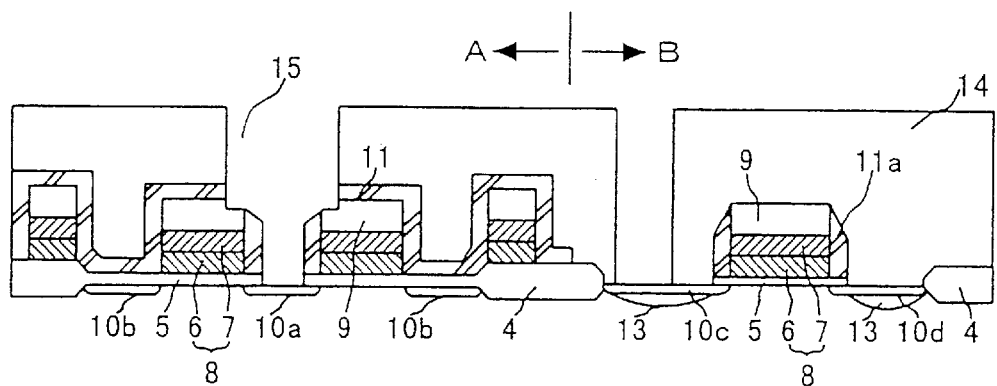

In FIG. 11, the nitride film 11 and the gate oxide film 5 formed above the source/drain region 10a of the memory cell portion A and in the inside of the bit line contact hole 15 are etched by anisotropic nitride film etching to expose the source/drain region 10a.

Figure 12:
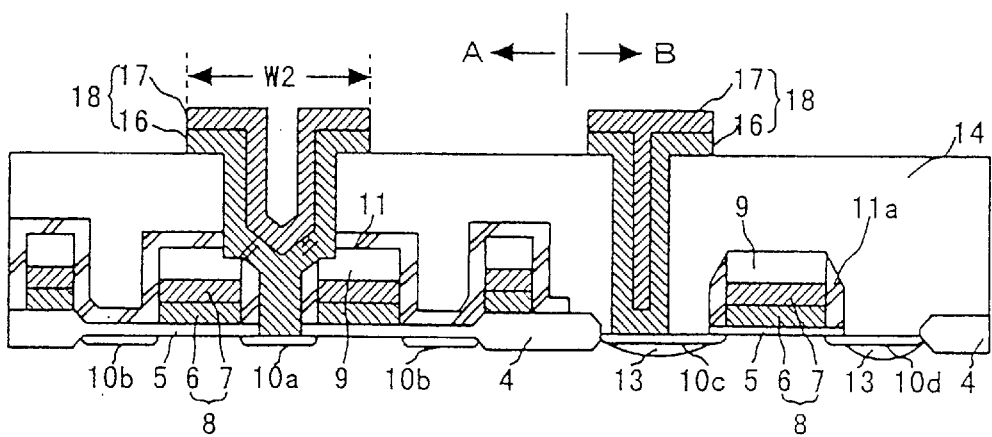

In FIG. 12, like the gate electrodes 8, phosphorus-doped polysilicon film 16 doped at a concentration of $5 \times 10^{20}$ atoms/cm$^3$ and tungsten silicide (WSi$_2$) film 17 are successively deposited each with a thickness of 500 angstroms to form a double-layered film 18 (a polyside). The film 18 is then subjected to photomechanical and anisotropic dry etching to form a desired pattern as shown. The width, W2, of the resultant polyside interconnection 18 is in the range of approximately 0.3 to 0.5 μm, and the interconnections serve as a bit line of DRAM, and are respectively connected to the source/drain regions 10a, 10c via the bit line contact holes 15.

Figure 13:
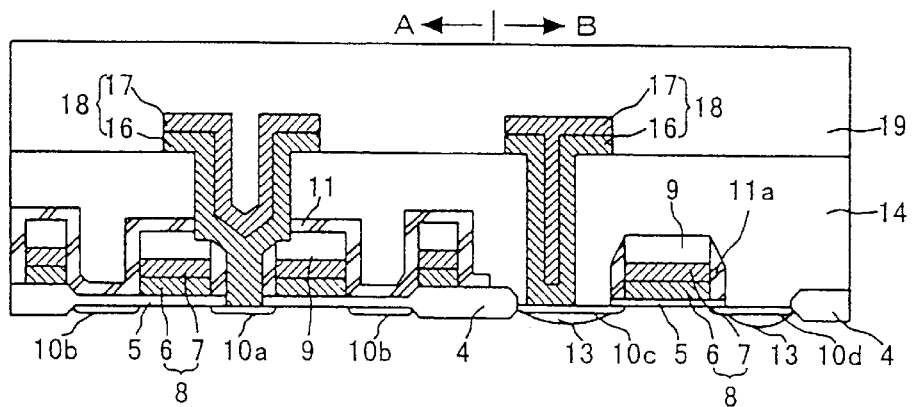

Referring to FIG. 13, an approximately 3000 angstroms thick silicon oxide film is deposited by CVD to form a layer insulating film 19.

Figure 14:
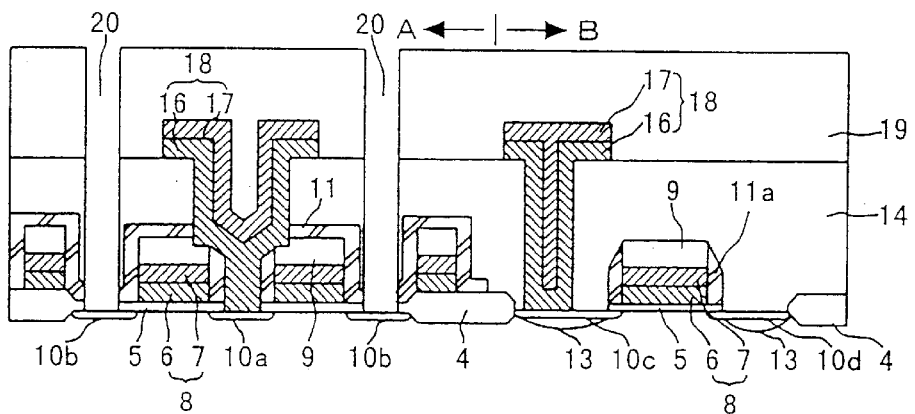

In FIG. 14, holes are made in the oxide films 19 and 14 at portions thereof which are positioned above the source/drain regions 10b and each of which is provided between adjacent gate electrodes 8 of the memory cell portion A as shown. Subsequently, the nitride film 11 and the oxide film 5 are further subjected to anisotropic nitride film dry etching to make holes. Thus, storage node contact holes 20 having a diameter of approximately 0.3 μm are formed extending to the source/drain regions 10b, respectively. The hole is a contact hole connecting the storage node and the active region 10b.

It will be noted that in FIG. 14, the storage node contact hole 20 is shown as not contacting the nitride film 11 provided at the side faces of the respective gate electrodes 8. In this connection, however, where the distance between the adjacent gate electrodes 8 is small, SAC is formed by means of the nitride film 11 covering both gate electrodes 8, as in the formation of the bit line contact hole 15 shown in FIG. 10.

Figure 15:
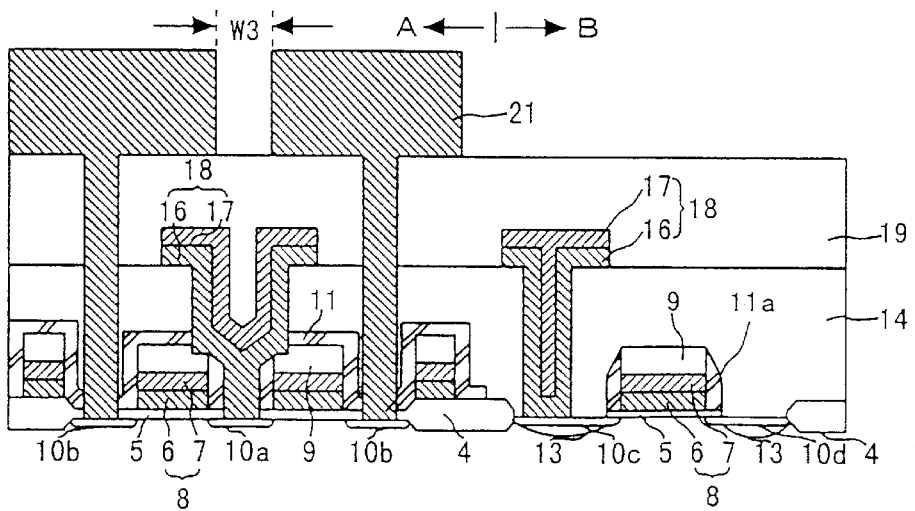

Referring to FIG. 15, phosphorus-doped polysilicon doped at a concentration of $5 \times 10^{20}$ atoms/cm$^3$ is deposited with a thickness of approximately 7000 angstroms by CVD to fill the storage node contact holes 20. Thereafter, desired portions of the phosphorus-doped polysilicon are left using photomechanical and anisotropic dry etching techniques to form storage nodes 21. The distance, W3, between the storage nodes 21 should be as small as possible so that the surface area of the storage nodes 21 is made large, and is usually approximately 0.25 μm. The storage nodes 21 are, respectively, connected to the n– source/drain regions 10b of the memory cell portion A via the contact holes 20.

Figure 16:
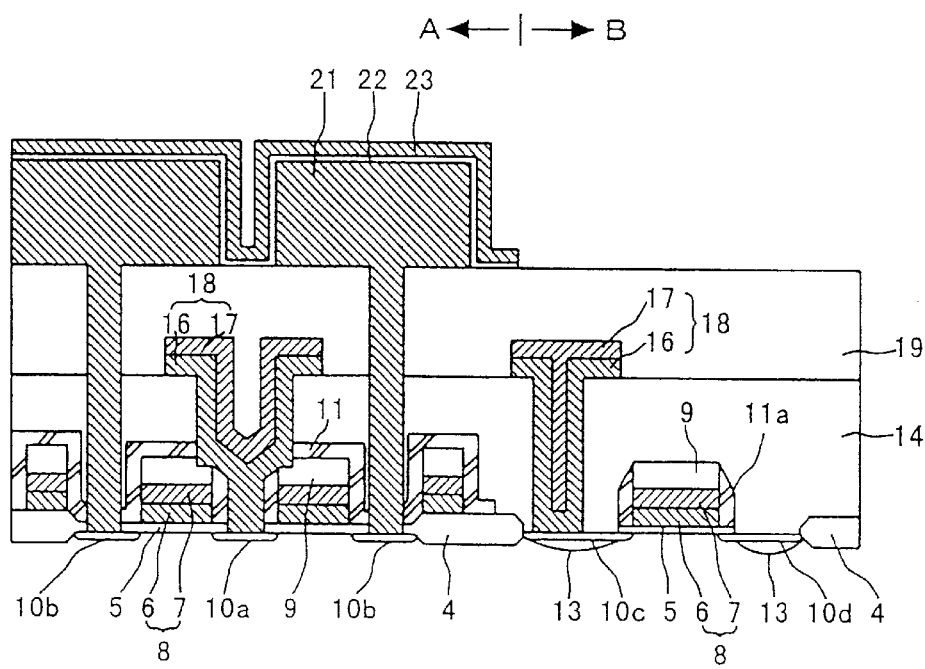

In FIG. 16, a silicon nitride film 22 serving as a dielectric film of a capacitor and a phosphorus-doped polysilicon film 23 doped at a concentration of approximately $5 \times 10^{20}$ atoms/cm$^3$ and serving as a cell plate are successively deposited with a thickness of 60 angstroms and 1000 angstroms. Thereafter, the doped polysilicon film 23 is removed from portions other than the memory cell portion A using photomechanical and anisotropic dry etching techniques to form a cell plate 23 thereby completing a capacitor.

Figure 17:
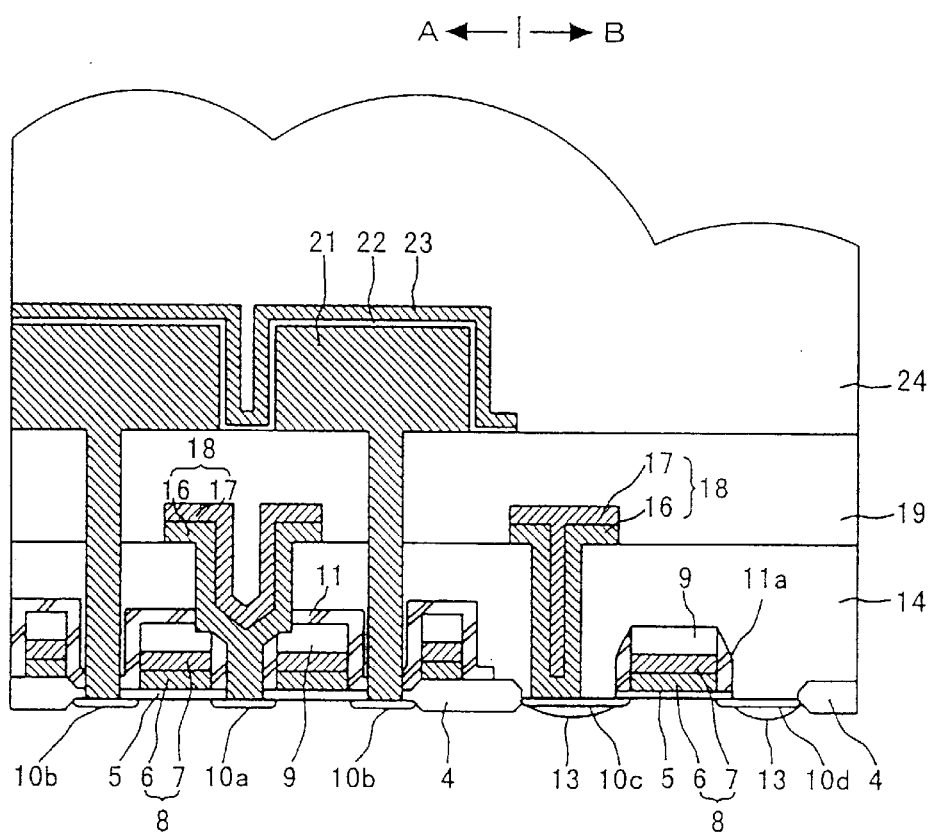

In FIG. 17, BPSG is deposited with a thickness of 5000 angstroms by CVD to form an interlayer insulating film 24.

Figure 18:
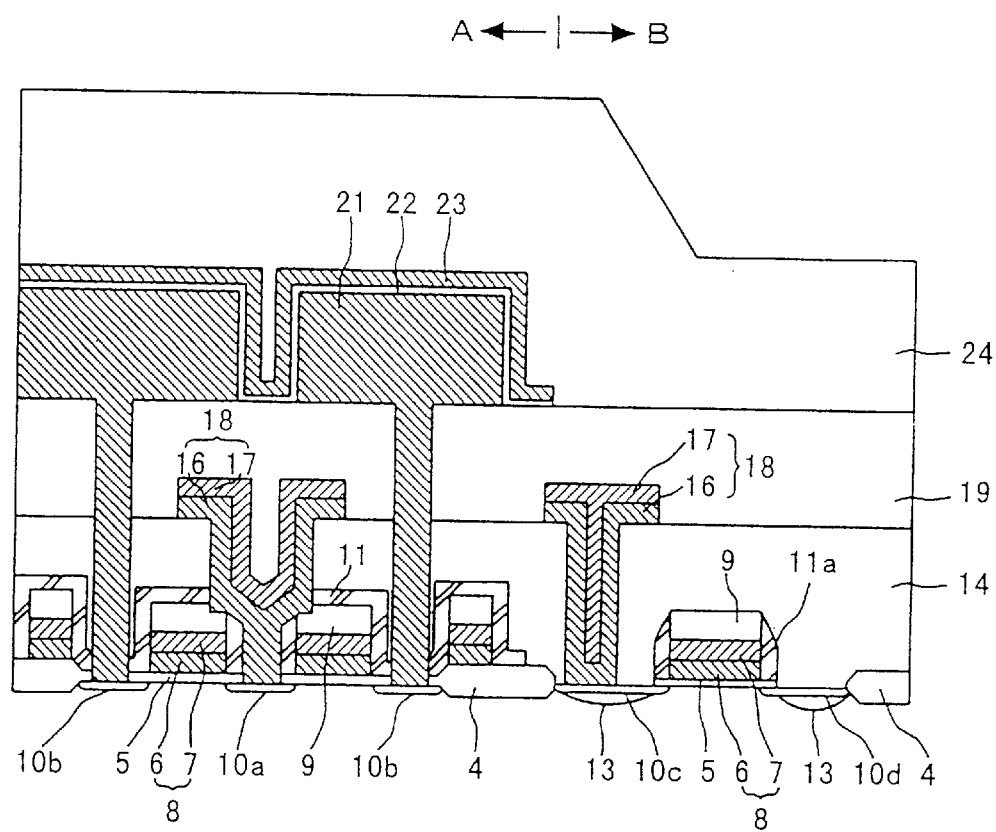

As is particularly shown in FIG. 18, like the layer insulating film 14, the layer insulating film 24 is thermally treated in an atmosphere of nitrogen at approximately 850° C. for about 30 minutes to make a smooth surface profile.

Figure 19:
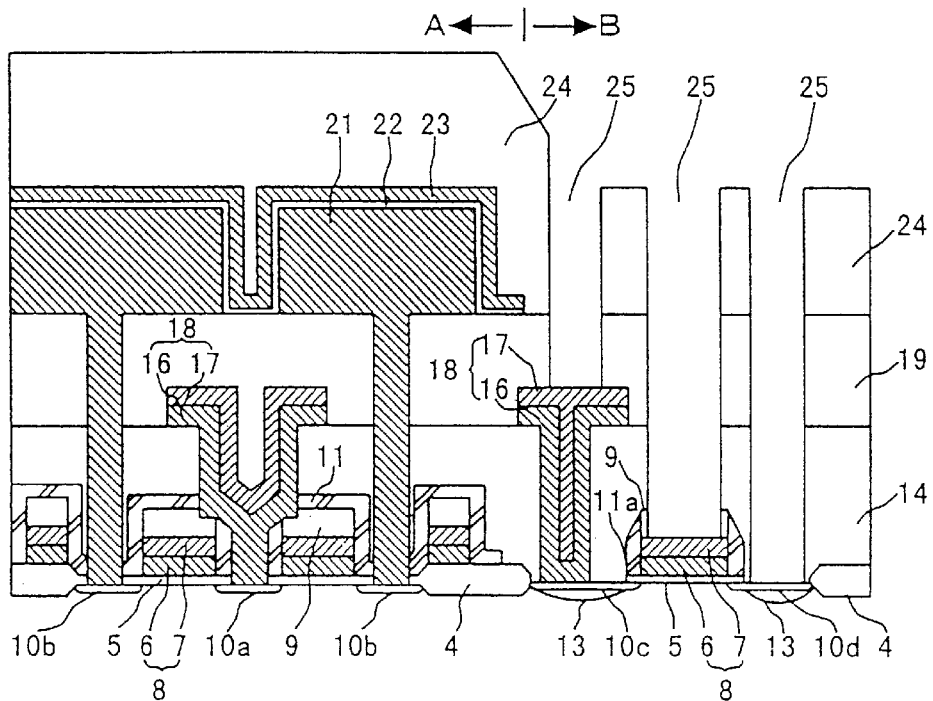

In FIG. 19, contact holes 25 each having a diameter of approximately 0.2 to 0.4 μm are, respectively, formed in portions of the peripheral circuit portion B above the source/drain region 10d, the gate electrode 8 and the bit line 18 using to photomechanical and anisotropic oxide film dry etching techniques. In this connection, since the gate electrode 8 is formed thereon with the silicon oxide film 9 and all the layer insulating films are made of the silicon oxide films 9, 14, 19 and 24, all the contact holes 25 can be made at the same time.

Figure 20:
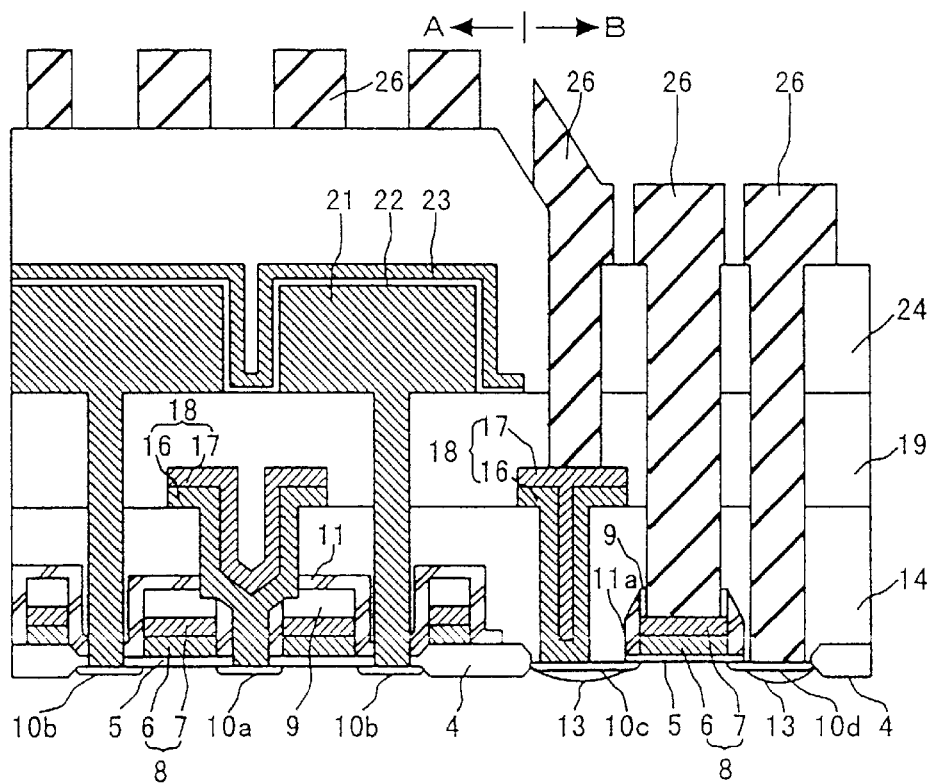
Figure 21:
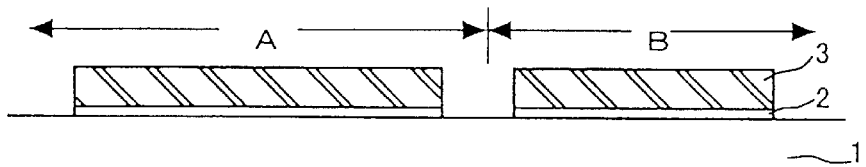
FIGS. 21 to 40 are sectional views for illustrating a conventional method of fabricating a DRAM.
Figure 22:
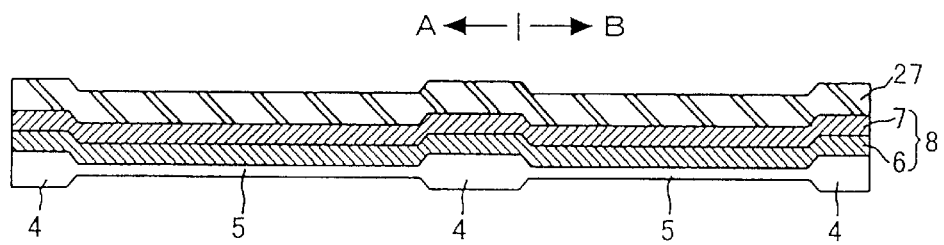
Figure 23:
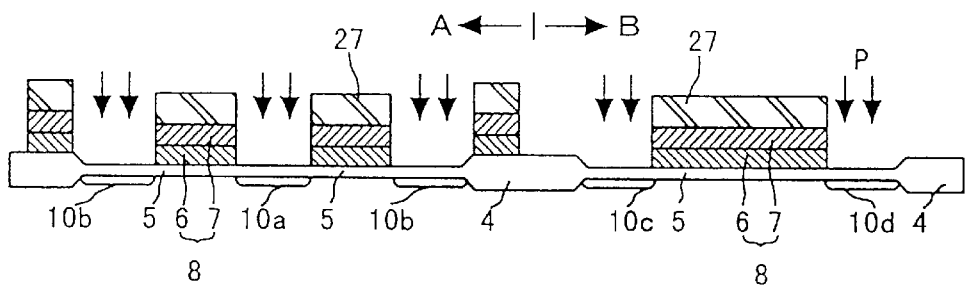
Figure 24:
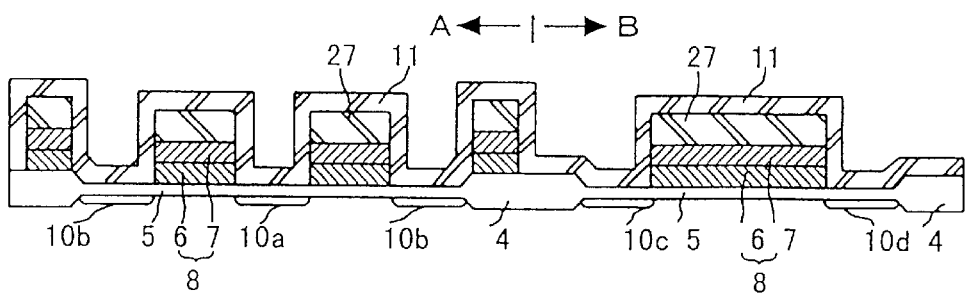
Figure 25:
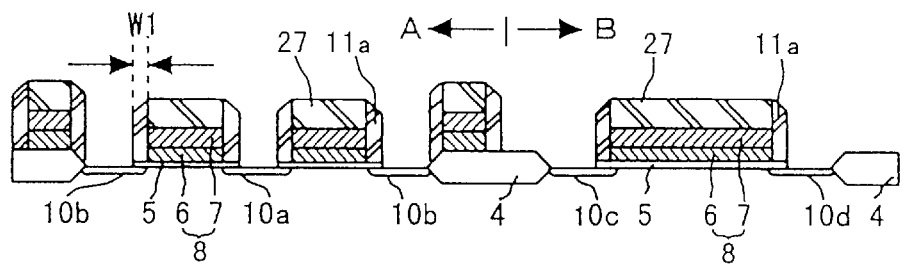
Figure 26:
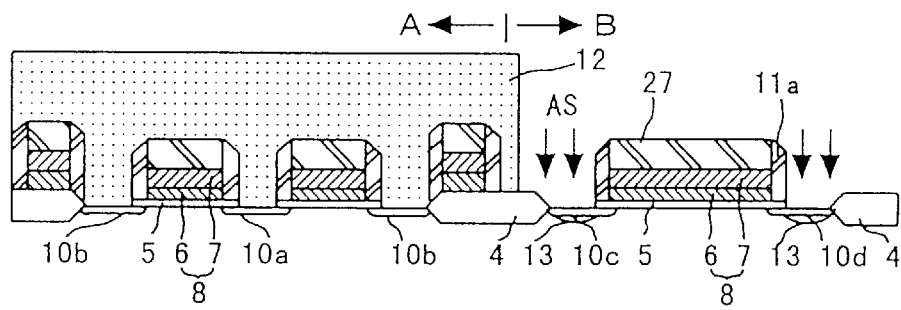
Figure 27:
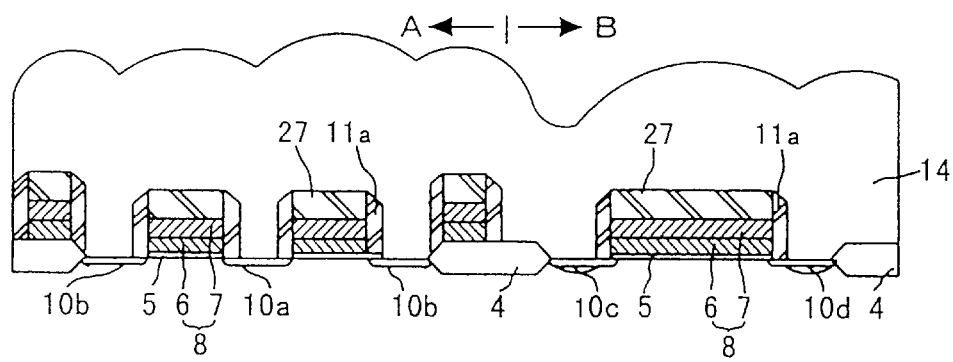
Figure 28:
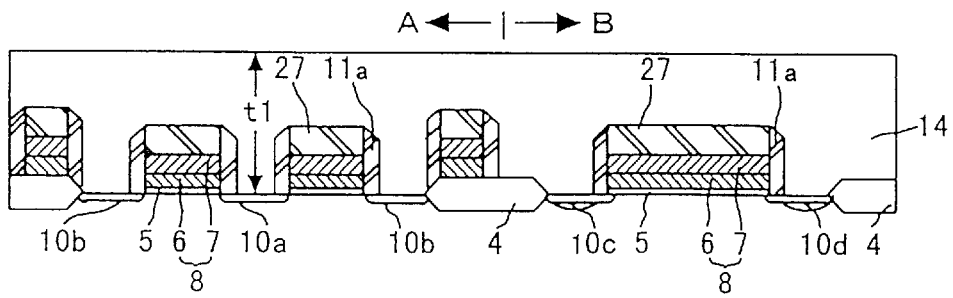
Figure 29:
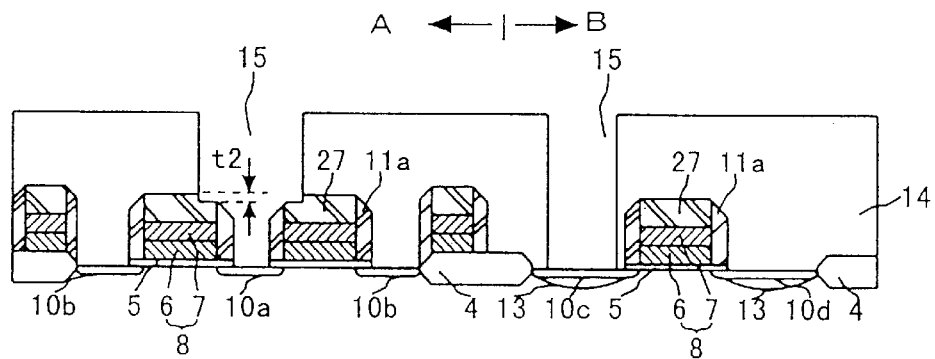
Figure 30:
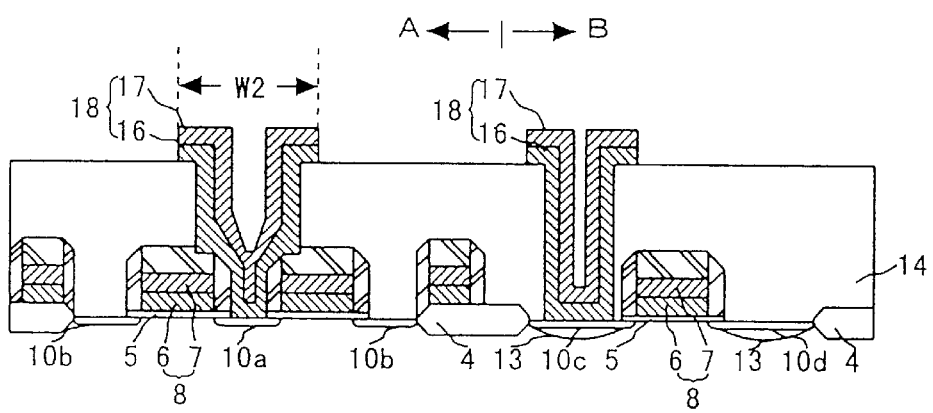
Figure 31:
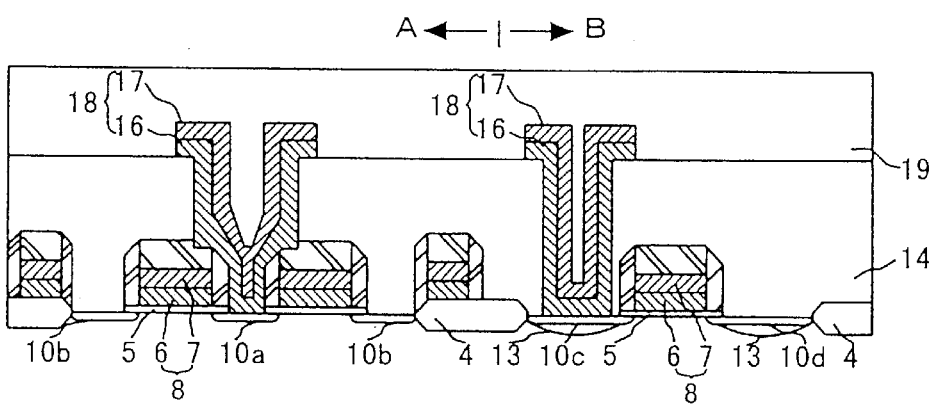
Figure 32:
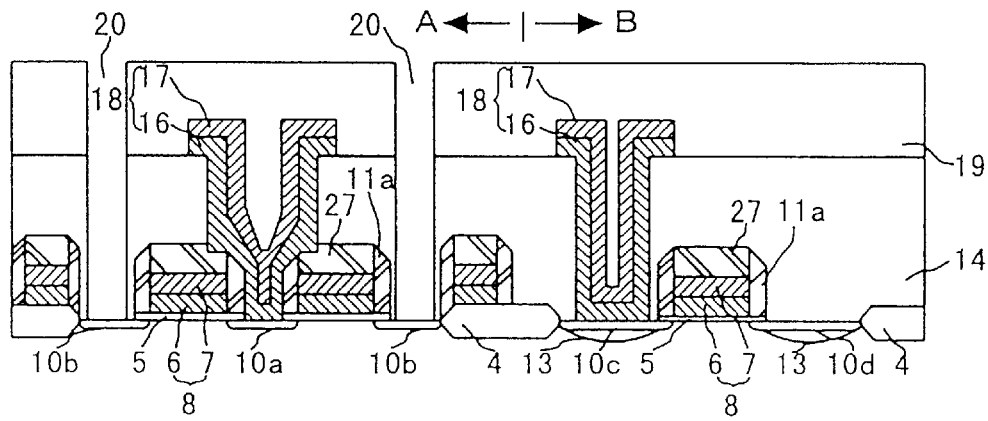
Figure 33:
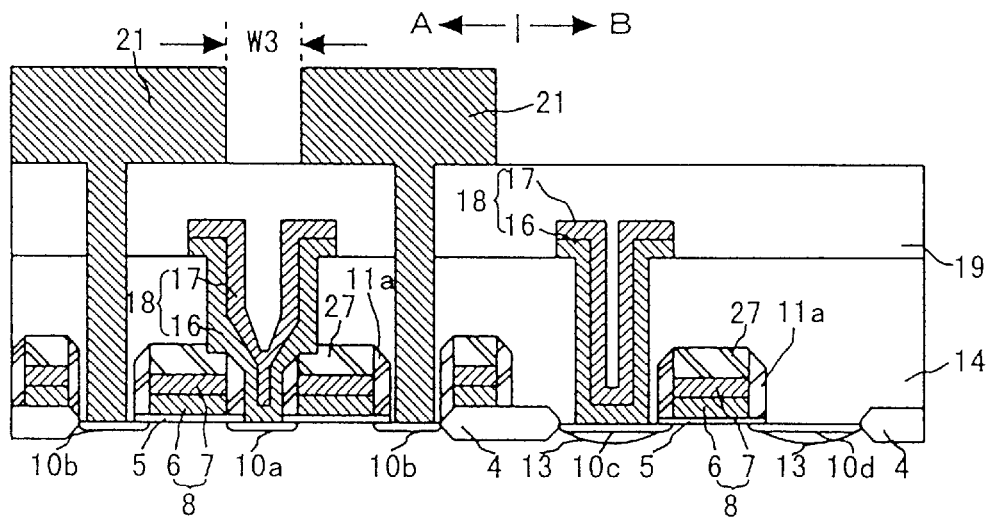
Figure 34:
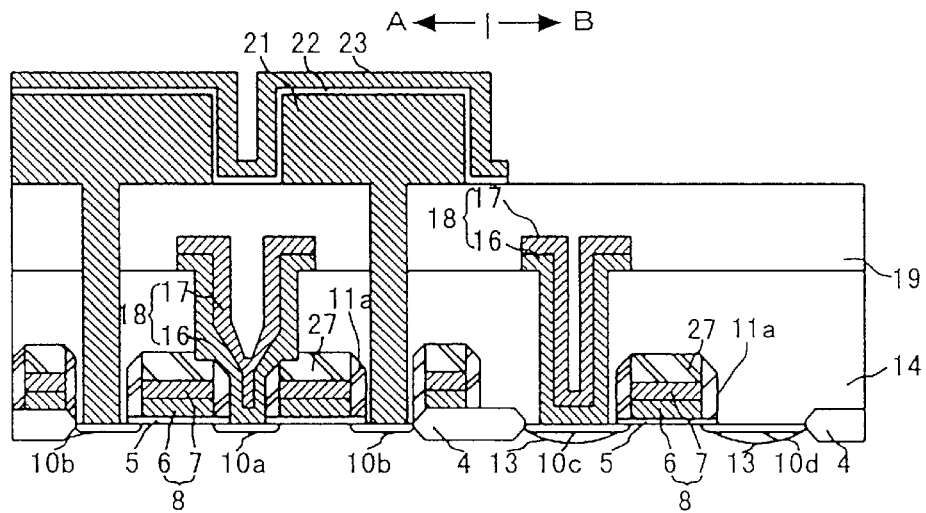
Figure 35:
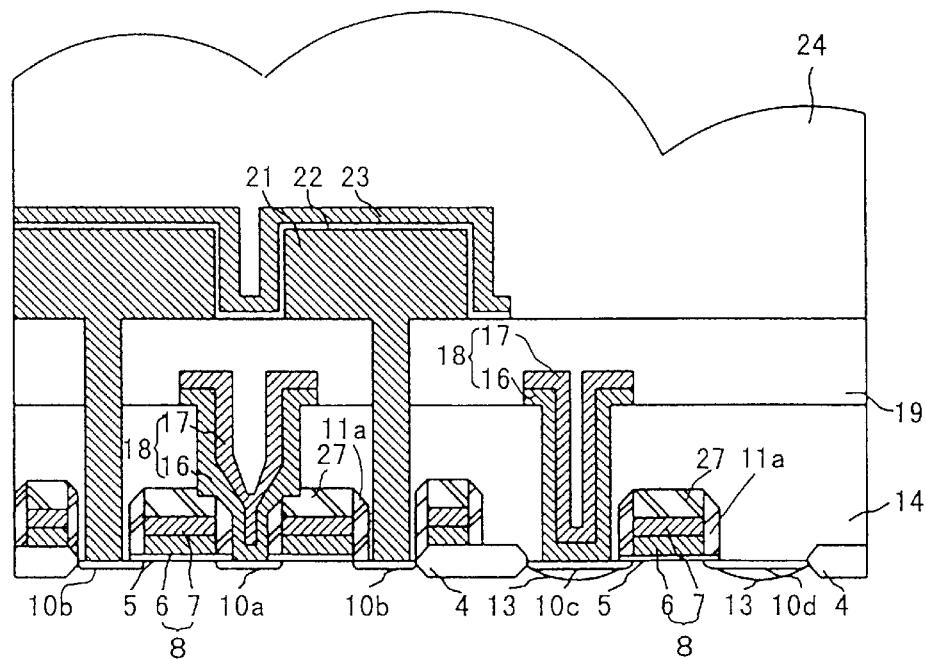
Figure 36:
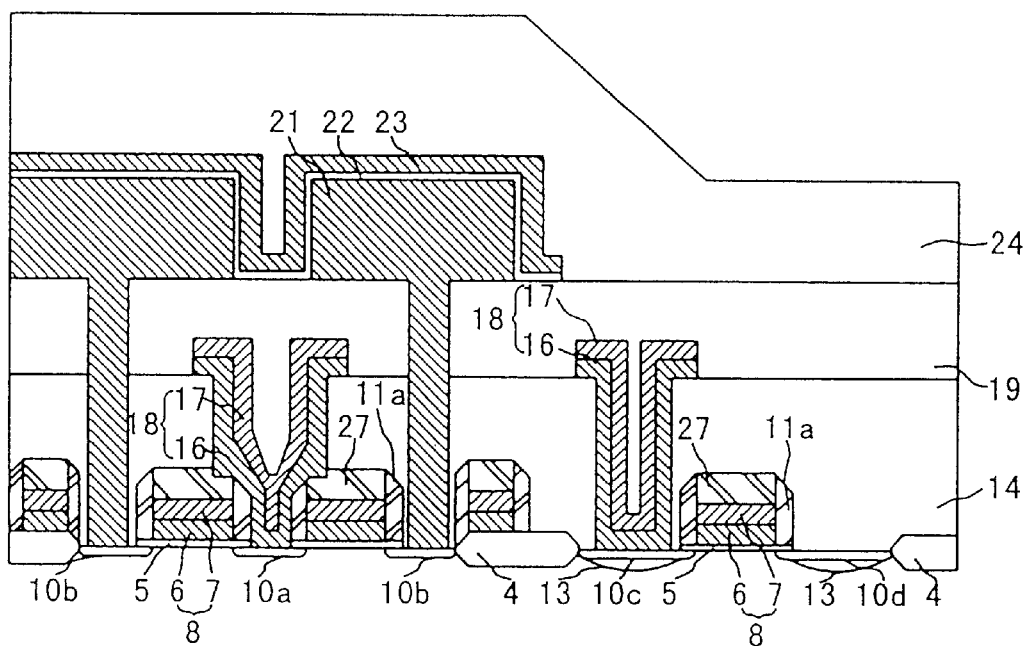
Figure 37:
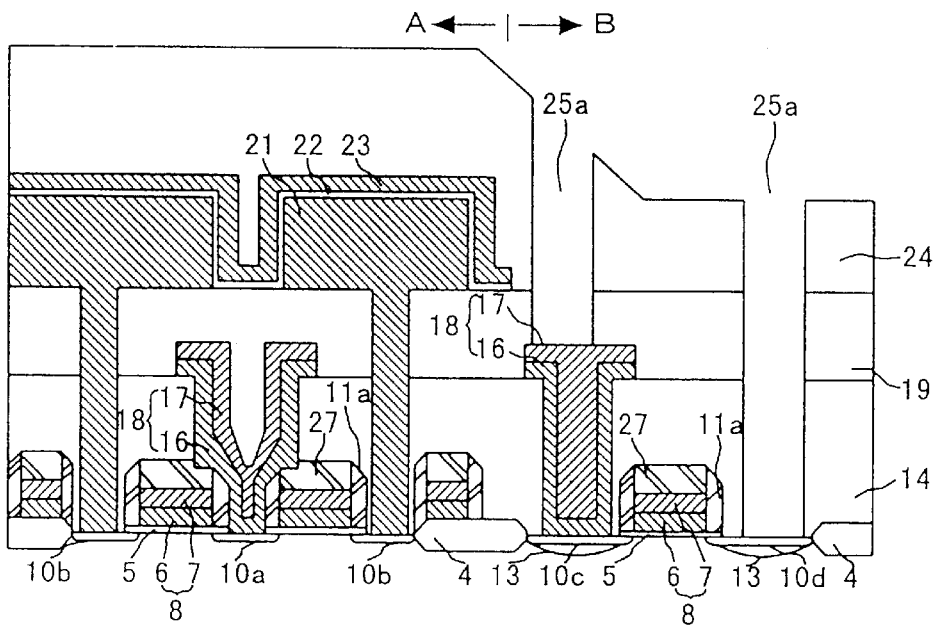
Figure 38:
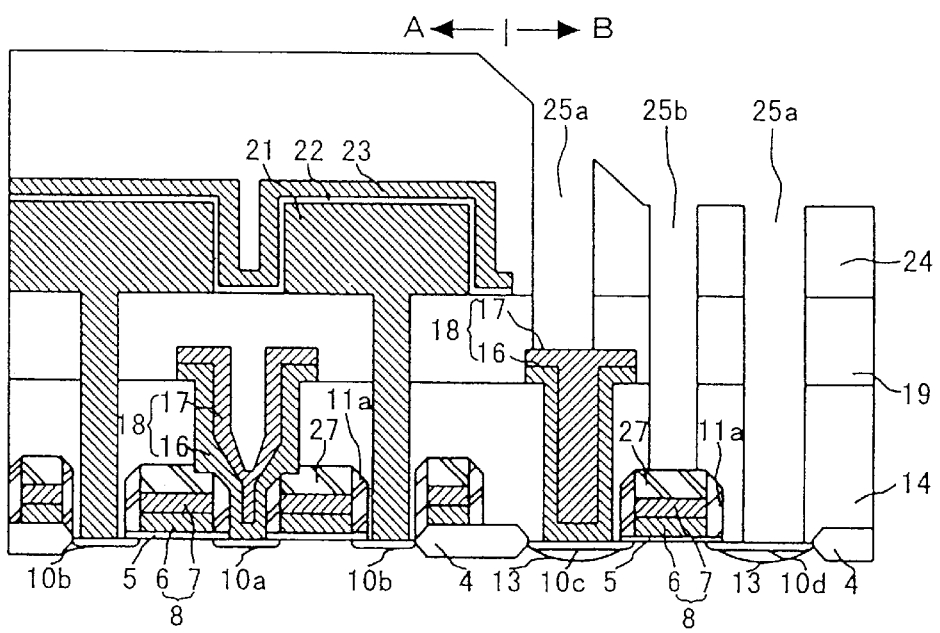
Figure 39:
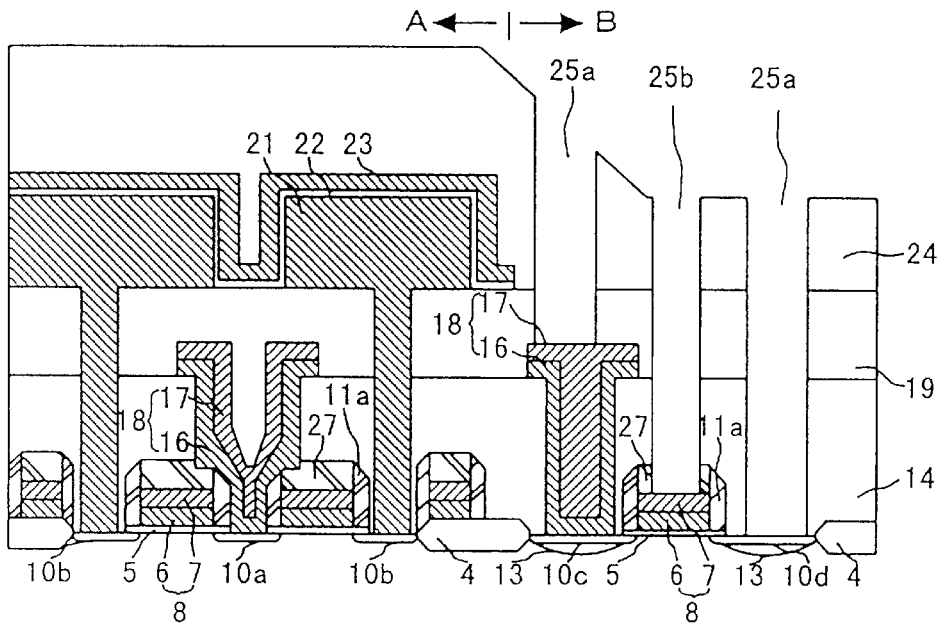
Figure 40:
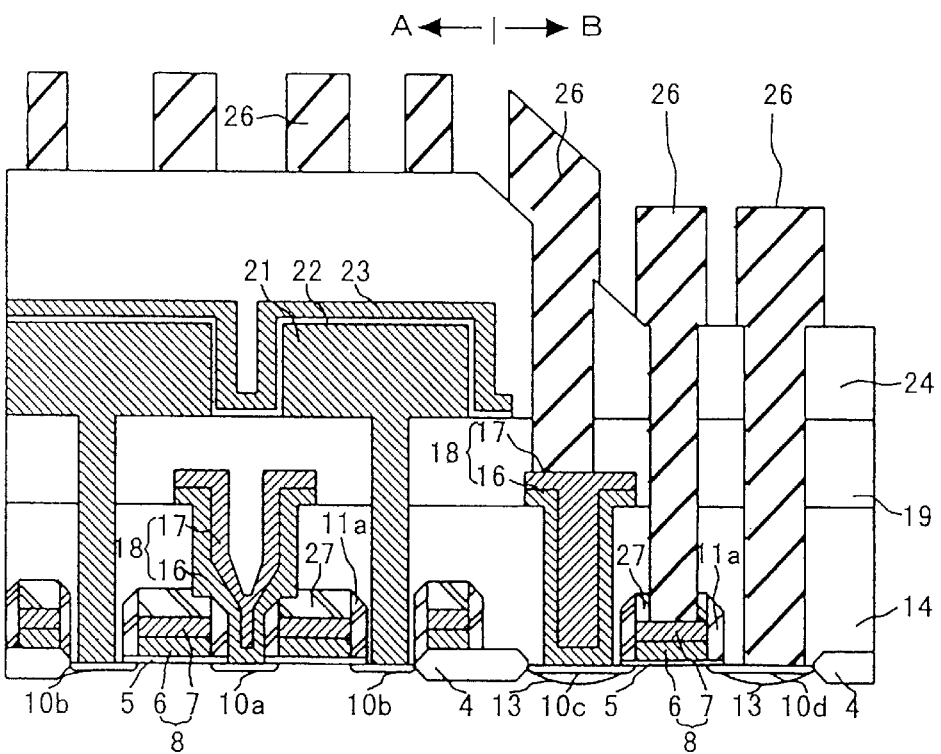

In FIG. 20, an aluminum film 26 is deposited by sputtering to fill the contact holes 25 therewith, followed by patterning the aluminum film 26 by photomechanical and anisotropic dry etching techniques to leave desired portions of the aluminum film 26, thereby forming aluminum interconnections 26 each having a width of approximately 0.4 to 0.5 μm.

According to the embodiment having set out hereinabove, the source/drain regions 10b of the memory cell portion A are protected with the nitride film 11 before the storage contact holes are formed in the step shown in FIG. 14. Thus, the regions 10b suffer little or no damage owing to etching in the preceding steps, causing data retention characteristics not to be degraded. In the peripheral circuit portion, no nitride film is formed on the gate electrode 8. This is advantageous in that, as shown in FIG. 19, the contact holes 25 can be formed in one step.

As will be apparent from the foregoing, the structure of the DRAM according to the present invention is particularly shown in FIG. 20. More particularly, the DRAM comprises a semiconductor substrate 1 having, on the main surface thereof, a memory cell portion A and a peripheral circuit portion B separated through an element separation oxide film 4. The semiconductor substrate 1 has, on the main surface thereof, a plurality of low-concentrated active regions 10a, 10b, 10c and 10d, i.e. source/drain regions, of which a MOS transistor is constituted. The peripheral circuit portion B has heavily doped active regions 13, i.e. source/drain regions, formed beneath the lightly doped active regions 10c, 10d, respectively. Gate insulating films 5 (first insulating films) are formed between a pair of active regions 10a and 10b and also between a pair of active regions 10c and 10d. A gate electrode 8 (first conductive film) made of a double-layered film (a polyside) which consists of a phosphorus-doped polysilicon film 6 and a tungsten silicide film 7 is formed on each gate insulating film 5. The gate electrode 8 has a silicon oxide film 9 formed thereon.

A silicon nitride film 11 is formed over the entire surface of the semiconductor substrate provided that the silicon nitride film 11 is formed to cover the side surfaces of each silicon oxide film 9 and each gate electrode 8 in the memory cell portion A. The silicon nitride film 11 is covered with a layer silicon oxide film 14 (second insulating film) as is particularly shown in FIG. 18.

A contact which is formed above the active region 10a, between the adjacent gate electrodes 8 and also between the silicon nitride films 11 formed on the side surfaces of the respective gate electrodes 8 is made extending via the interlayer silicon oxide film 14, the silicon nitride film 11 formed on the gate insulating film 5, and the gate insulating film 5 to the active region 10a. This contact is for a bit line 18.

Likewise, a contact which is formed above each active region 10b, between the adjacent gate electrodes 8 and also between the silicon nitride films formed on the side surfaces of the gate electrodes 8 is formed extending via the interlayer silicon oxide film 14, the silicon nitride film 11 formed on the gate insulating film 5, and the gate insulating film 5 to the active region 10b. This contact is for storage nodes 21.

A bit line 18 is formed on the interlayer oxide film 14, on which an interlayer silicon oxide film 19 is formed. A storage node 21 is formed on the interlayer silicon oxide film 19, and a cell plate 23 is formed through a dielectric film 22, thereby forming a capacitor. An interlayer silicon oxide film 24 is formed on the cell plate 23, on which aluminum interconnections 26 are located.

On the other hand, the peripheral circuit portion B includes side wall-shaped silicon nitride films 11a formed on the side surfaces of the gate electrode 8 (first conductive film). The interlayer silicon oxide film 14 (second insulating film) is formed over the semiconductor substrate to cover the silicon oxide film 9 and the silicon nitride films 11a.

A gate contact is formed above the gate electrode 8 extending via the interlayer silicon oxide film 14 and the silicon oxide film 9 to the gate electrode 8.

Likewise, a contact is formed above the active region 10d and extends via the interlayer silicon oxide film 14 and the gate insulating film 5 to the active region 10d.

A bit line 18 is formed on the interlayer insulating film 14 and is connected to the active region 10c through the bit line contact.

The interlayer insulating film 19 is formed over the bit line 18, on which an interlayer insulating film 24 is further formed. Holes are made in these interlayer oxide films 24, 19, through which a contact made of an aluminum interconnection 26 to the bit line 18 is formed. The contact to the active region 10d and the contact to the gate electrode 8 as having set out hereinbefore are, respectively, made by means of the aluminum interconnection 26 through a contact hole made in the interlayer insulating films 24, 19.

In the DRAM having such an arrangement as set forth above, the source/drain regions 10b of the memory cell portion A suffer no damage with etching, thereby causing data retention characteristics not to be degraded. In the peripheral circuit portion, no nitride film is formed above the gate electrode 8. The contact holes 25 can be formed by one step.

As will be apparent from the foregoing, according to the invention, contacts suffer no damages as would be otherwise caused during the course of etching, thus preventing the degradation of data retention characteristics such as of semiconductor memories. Moreover, a plurality of contacts can be simultaneously formed in different regions, thereby leading to reduced number of steps of fabricating the semiconductor device.

Obviously many modifications and variations of the present invention are possible in the light of the above teachings. It is therefore to be understood that within the scope of the appended claims the invention may be practiced otherwise than as specifically described.

What is claimed is:

1. A semiconductor device comprising:
   a semiconductor substrate;
   a memory cell portion formed on the substrate, comprising:
   a plurality of first active regions having a first impurity concentration, formed in a surface of the substrate within the memory cell portion;
   a plurality of first gate electrodes, each first gate electrode comprising:
   a dielectric layer formed on the substrate;
   a gate conductive layer formed on the gate dielectric layer; and
   a silicon oxide layer formed on each gate conductive layer;
   a silicon nitride film formed over the substrate, wherein the silicon nitride film overlies the first active regions and the silicon oxide layer on each gate conductive layer and contacts side surfaces of each silicon oxide layer and gate conductive layer, the silicon nitride film overlying the entirety of the first active regions at least in a direction in which two neighboring first gate electrodes and a first active region therebetween are arranged;
   an interlayer dielectric formed over the substrate including to cover the silicon nitride film; and
   a plurality of first local interconnections extending to the first active regions through the interlayer dielectric and the silicon nitride film; and
   a peripheral circuit portion formed on the substrate, comprising:
   a plurality of second active regions having a second impurity concentration, formed in the surface of the substrate;
   a plurality of second gate electrodes, each having an upper surface and comprising:
   a dielectric layer formed on the substrate; and
   a gate conductive layer formed on the gate dielectric layer;
   a plurality of silicon nitride sidewall spacers contacting side surfaces of each second gate electrode;
   the interlayer dielectric formed over the substrate to cover the second active regions, the second gate electrodes, and the silicon nitride sidewall spacers;
   a plurality of second local interconnections extending to the second active regions through the interlayer dielectric; and
   a plurality of third local interconnections extending to the second gate electrodes through the interlayer dielectric, wherein the silicon nitride film does not overly the upper surface of the plurality of second gate electrodes.

2. The semiconductor device according to claim 1, wherein the silicon nitride film within the memory cell portion contacts top and side surfaces of the first gate electrodes.

3. The semiconductor device according to claim 1, wherein the memory cell portion further comprises a plurality of oxide films formed between the first active regions and the silicon nitride film.

4. The semiconductor device according to claim 3, wherein the first local interconnections extend to the first active regions through the interlayer dielectric, the silicon nitride film, and the oxide films.

5. The semiconductor device according to claim 1, wherein each first active regions are electrically connected to a bit line or a storage node through the first local interconnections.

6. The semiconductor device according to claim 1, wherein the first impurity concentration of the first active regions is less than the second impurity concentration of the second active regions.

7. The semiconductor device according to claim 1, wherein said first and second active regions are source/drain regions of MOS transistors.

8. A semiconductor device comprising:
   a semiconductor substrate;
   a memory cell portion formed on the substrate, comprising:
   a plurality of first active regions having a first impurity concentration, formed in a surface of the substrate within the memory cell portion;
   an insulating film formed on the substrate;
   a plurality of first gate conductive layers formed on the insulating film; and
   a silicon oxide layer formed on each first gate conductive layer;
   a silicon nitride film covering the insulating film and the silicon oxide layer, wherein the silicon nitride film overlies and contacts side surfaces of each silicon oxide layer and first gate conductive layer, the silicon nitride film overlying the entirety of the first active regions at least in a direction in which two neighboring first gate conductive layers and a first active region therebetween are arranged;
   an interlayer dielectric formed over the substrate to cover the silicon nitride film; and
   a plurality of first local interconnections extending to the first active regions through the interlayer dielectric, the silicon nitride film, and the insulating film; and a peripheral circuit portion formed on the substrate, further comprising:
  a plurality of second active regions having a second impurity concentration, formed in the surface of the substrate;
  a plurality of second gate electrodes, each second gate electrode having an upper surface and comprising:
    a gate dielectric layer formed on the substrate; and
    a second gate conductive layer formed on the gate dielectric layer;
  a plurality of silicon nitride sidewall spacers contacting side surfaces of the second gate conductive layers;
  the interlayer dielectric formed over the substrate to cover the second active regions, the second gate conductive layers, and the silicon nitride sidewall spacers;
  a plurality of second local interconnections extending to the second active regions through the interlayer dielectric; and
  a plurality of third local interconnections extending to the second gate conductive layers through the interlayer dielectric, wherein the silicon nitride film does not overly the upper surface of the plurality of second gate electrodes.

9. The semiconductor device according to claim 8, wherein said first and second active regions are source/drain regions of MOS transistors.

10. The semiconductor device according to claim 8, wherein the silicon nitride film contacts top and side surfaces of the first gate conductive layers.

11. The semiconductor device according to claim 8, wherein the first impurity concentration of the first active regions is less than the second impurity concentration of the second active regions.

12. The semiconductor device according to claim 8, wherein each first active regions are electrically connected to a bit line or a storage node through the first local interconnections.

13. A semiconductor device manufactured by a method comprising the step of:
  forming an insulating film on a semiconductor substrate, the substrate having a memory cell portion and a peripheral circuit portion;
  forming a conductive layer on the insulating film;
  forming a silicon oxide film on the first conductive layer;
  patterning the silicon oxide film and the conductive layer to form a plurality of gate electrodes comprising the insulating film, the first conductive layer and the silicon oxide film;
  introducing an impurity into the main surface of the substrate to form a plurality of active regions in the surface of the substrate;
  forming a silicon nitride film over the surface of the substrate including the insulating film and the gate electrodes, wherein the silicon nitride film overlies and contacts side surfaces of the gate electrode, the silicon nitride film overlaying the entirety of the active regions at least in a direction in which two neighboring gate electrodes and an active region therebetween are arranged;
  etching the silicon nitride film in the peripheral circuit portion to form a plurality of silicon nitride sidewall spacers contacting side surfaces of the gate electrodes within the peripheral circuit portion such that the silicon nitride film does not overly an upper surface of the gate electrodes within the peripheral circuit portion;
  forming an interlayer dielectric over the substrate including the silicon nitride film within the memory cell portion, and silicon nitride sidewall spacers and gate electrode within the peripheral circuit portion;
  forming a plurality of first via holes extending to the active regions within the memory cell portion via the interlayer dielectric, the silicon nitride layer and the insulating film;
  forming a plurality of second via holes extending to the active regions within the peripheral circuit portion via the interlayer dielectric; and
  forming a plurality of third via holes extending to the conductive layer of the gate electrodes within the peripheral circuit portion through the interlayer dielectric and the silicon oxide film.

* * * * *